(12) United States Patent  
Kanehiro

(10) Patent No.: US 12,532,639 B2  
(45) Date of Patent: Jan. 20, 2026

(54) DISPLAY DEVICE THAT IMPROVES EFFICIENCY IN RELEASING LIGHT FROM A LIGHT-EMITTING LAYER AND METHOD FOR PRODUCING DISPLAY DEVICE

(71) Applicant: SHARP KABUSHIKI KAISHA, Sakai (JP)

(72) Inventor: Masayuki Kanehiro, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 573 days.

(21) Appl. No.: 17/918,310

(22) PCT Filed: May 26, 2020

(86) PCT No.: PCT/JP2020/020647  
§ 371 (c)(1),  
(2) Date: Oct. 11, 2022

(87) PCT Pub. No.: WO2021/240621  
PCT Pub. Date: Dec. 2, 2021

(65) Prior Publication Data  
US 2023/0147280 A1    May 11, 2023

(51) Int. Cl.  
*H10K 59/35* (2023.01)  
*H10K 59/12* (2023.01)  
*H10K 59/80* (2023.01)

(52) U.S. Cl.  
CPC ... *H10K 59/80522* (2023.02); *H10K 59/1201* (2023.02); *H10K 59/35* (2023.02); *H10K 59/80518* (2023.02); *H10K 59/12* (2023.02); *H10K 59/80516* (2023.02)

(58) Field of Classification Search  
CPC ....... H10K 59/80522; H10K 59/80518; H10K 59/35; H10K 59/1201  
See application file for complete search history.

(56) References Cited

U.S. PATENT DOCUMENTS

| | | |
|---|---|---|
| 2005/0140277 A1 | 6/2005 | Suzuki et al. |
| 2006/0115231 A1 | 6/2006 | Ishida |
| 2007/0003743 A1 | 1/2007 | Asano et al. |
| 2007/0015429 A1* | 1/2007 | Maeda ............ H10K 59/80517  313/506 |
| 2007/0114922 A1 | 5/2007 | Sung et al. |
| 2010/0006845 A1 | 1/2010 | Seo et al. |
| 2010/0247810 A1 | 9/2010 | Yukinobu et al. |
| 2010/0295828 A1 | 11/2010 | Sung et al. |
| 2012/0138894 A1 | 6/2012 | Qian et al. |

(Continued)

FOREIGN PATENT DOCUMENTS

| | | |
|---|---|---|
| JP | 2005197011 A | 7/2005 |
| JP | 2006085956 A | 3/2006 |

(Continued)

*Primary Examiner* — Suberr L Chi  
(74) *Attorney, Agent, or Firm* — ScienBiziP, P.C.

(57) ABSTRACT

A display device includes a light-emitting-element layer including a plurality of light-emitting elements each including a first electrode, a functional layer, and a second electrode. The plurality of light-emitting elements are formed to emit lights in different colors. A nanoparticle layer is provided on a surface of the first electrode toward a light-emitting layer, and contains metal oxide nanoparticles that are electrically conductive.

8 Claims, 17 Drawing Sheets

(56) References Cited

U.S. PATENT DOCUMENTS

| | | | |
|---|---|---|---|
| 2014/0145190 A1 | 5/2014 | Seo et al. | |
| 2015/0214251 A1 | 7/2015 | Seo et al. | |
| 2018/0247982 A1* | 8/2018 | Kim | H10K 50/818 |
| 2019/0115372 A1 | 4/2019 | Seo et al. | |
| 2019/0326558 A1* | 10/2019 | Ahmed | H10K 50/86 |
| 2020/0203385 A1 | 6/2020 | Seo et al. | |
| 2021/0020838 A1* | 1/2021 | Qin | C09K 11/06 |
| 2021/0225888 A1 | 7/2021 | Seo et al. | |

FOREIGN PATENT DOCUMENTS

| | | |
|---|---|---|
| JP | 2006154169 A | 6/2006 |
| JP | 2007141847 A | 6/2007 |
| JP | 2009231361 A | 10/2009 |
| JP | 2010040520 A | 2/2010 |
| JP | 2012004583 A | 1/2012 |
| JP | 2012234748 A | 11/2012 |
| JP | 2012533156 A | 12/2012 |
| JP | 2014052775 A | 3/2014 |
| WO | 2009057637 A1 | 5/2009 |
| WO | 2015190335 A1 | 12/2015 |

* cited by examiner

FIG. 7
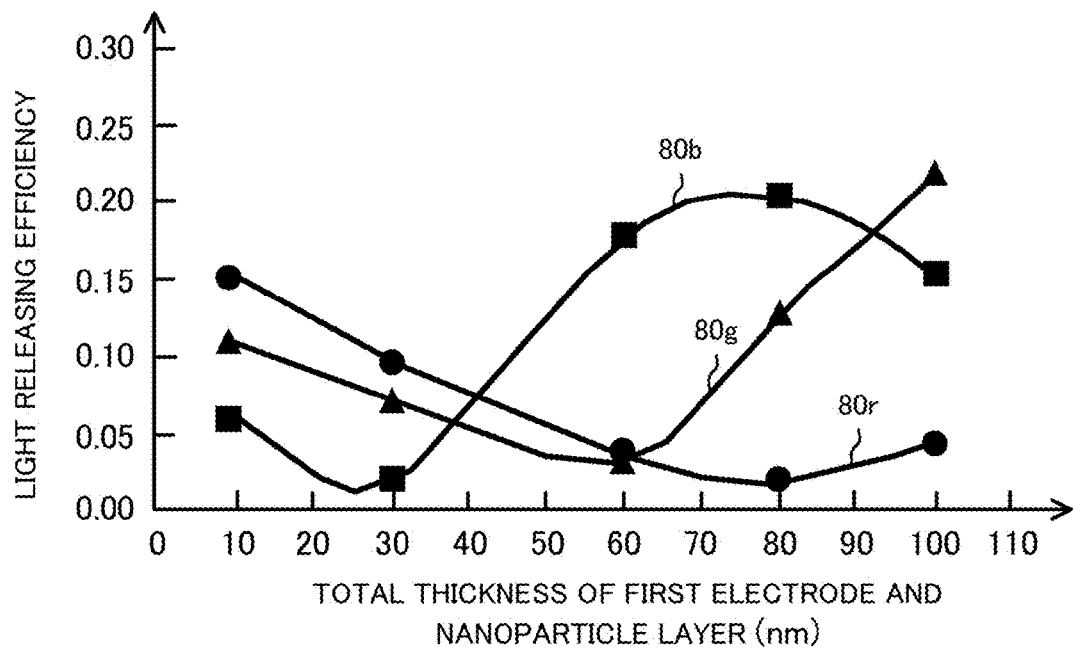
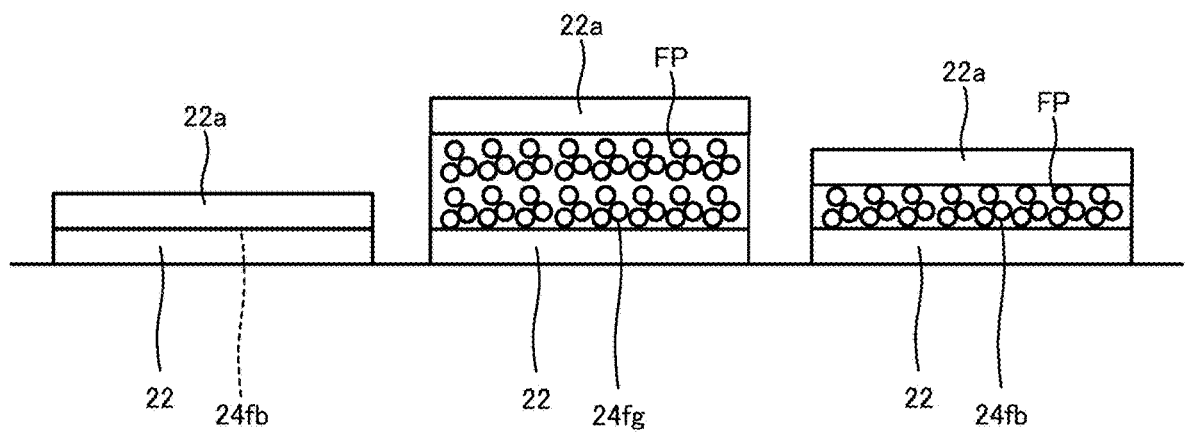

FIG. 9
(a)
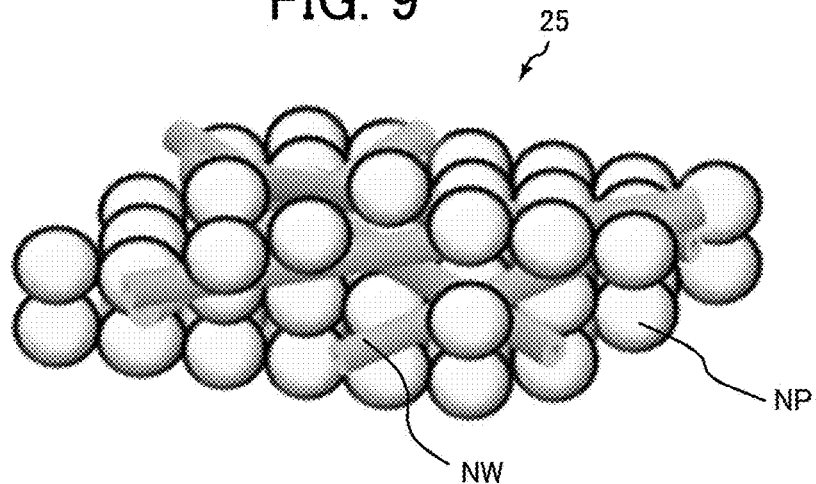
(b)
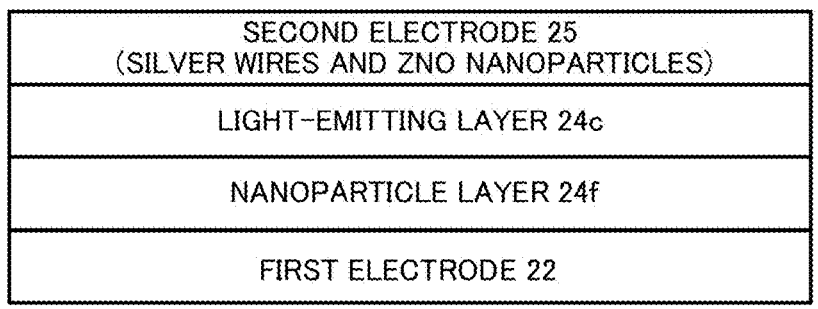
(c)
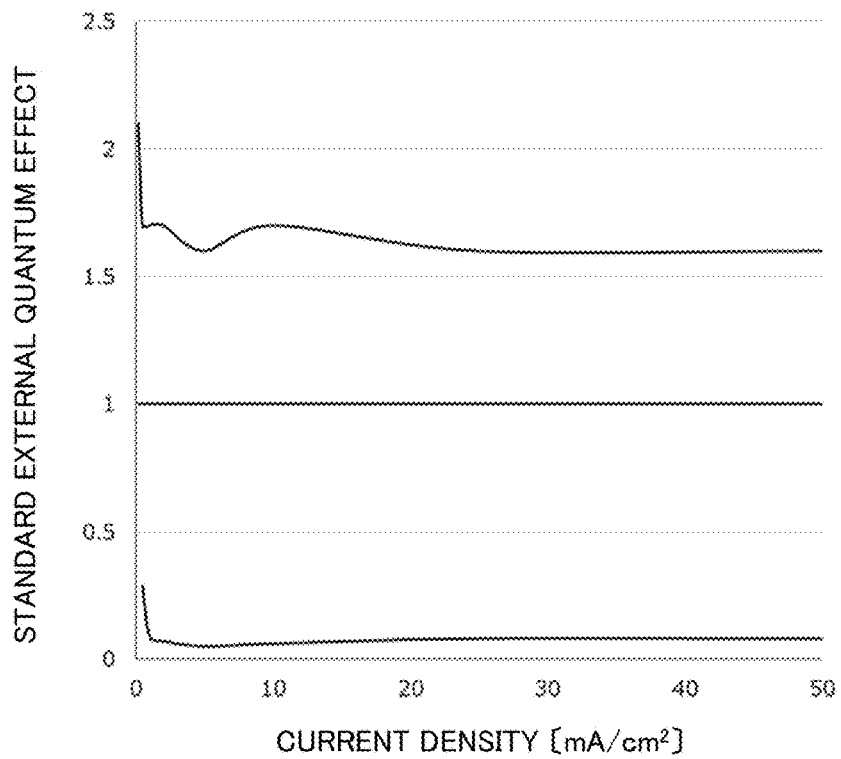

DISPLAY DEVICE THAT IMPROVES EFFICIENCY IN RELEASING LIGHT FROM A LIGHT-EMITTING LAYER AND METHOD FOR PRODUCING DISPLAY DEVICE

TECHNICAL FIELD

The disclosure relates to a display device and a method for producing the display device.

BACKGROUND ART

Recent years have seen development and actual use of light-emitting display devices instead of non-light-emitting liquid crystal display devices. Such a display device, which does not require a back light apparatus, includes, for example, light-emitting elements such as organic light-emitting diodes (OLEDs) and quantum-dot light-emitting diodes (QLEDs) each provided for a pixel.

Moreover, the light-emitting display device described above includes: a first electrode; a second electrode; and a functional layer provided between the first electrode and the second electrode. The functional layer includes at least a light-emitting layer (see, for example, Patent Document 1 below).

CITATION LIST

Patent Literature

[Patent Document 1] Japanese Unexamined Patent Application Publication No.

SUMMARY

Technical Problem

As to the above known display device and a method for producing the display device, for example, the first electrode, the functional layer, and the second electrode are sequentially stacked on top of another. The first electrode is formed of a light-reflective electrode material, and the second electrode is formed of a light-transparent electrode material. The light from the light-emitting layer is emitted from toward the second electrode. Such a display device is known as a top-emission display device.

However, the above known top-emission display device has a problem of low efficiency in releasing light from the light-emitting layer.

In view of the above problem, an object of the disclosure is to provide a display device that can improve efficiency in releasing light from a light-emitting layer, and a method for producing the display device.

Solution to Problem

In order to achieve the above object, a display device according to the disclosure includes: a display region having a plurality of pixels; and a frame region surrounding the display region. The display device includes:
 a thin-film-transistor layer;
 a light-emitting-element layer including a plurality of light-emitting elements each including a first electrode, a light-emitting layer, and a second electrode, the plurality of light-emitting elements being formed to emit light in different colors; and
 a nanoparticle layer provided on a surface of the first electrode toward the light-emitting layer, and containing metal oxide nanoparticles that are electrically conductive.

In the above display device, the nanoparticle layer contains metal oxide nanoparticles that are electrically conductive. Moreover, the nanoparticle layer is provided on the surface of the first electrode toward the light-emitting layer. Such features can improve efficiency in releasing light from the light-emitting layer of the display device.

Moreover, the disclosure relates to a method for producing a display device. The display device includes: a display region having a plurality of pixels; and a frame region surrounding the display region. The display device includes: a thin-film-transistor layer; and a light-emitting-element layer including a plurality of light-emitting elements each including a first electrode, a light-emitting layer, and a second electrode. The plurality of light-emitting elements are formed to emit light in different colors. The method includes:
 a first electrode forming step of forming the first electrode for each of the plurality of light-emitting elements;
 a solution droplet delivering step of delivering a solution in a form of droplets onto a surface of the first electrode, the solution containing metal-oxide nanoparticles that are electrically conductive; and
 a nanoparticle layer forming step of forming a nanoparticle layer made of the solution delivered in the form of droplets, the nanoparticle layer containing the metal-oxide nanoparticles.

In the above method for producing the display device, at the first electrode forming step, a first electrode 22 is formed for each of the plurality of light-emitting elements. At the solution droplet delivering step, a solution is delivered in the form of droplets onto the surface of the first electrode. The solution containing metal-oxide nanoparticles are electrically conductive. Moreover, at the nanoparticle layer forming step, the nanoparticle layer is formed of the solution delivered in the form of droplets. The nanoparticle layer contains the metal-oxide nanoparticles. Such features can improve efficiency in releasing light from the light-emitting layer of the display device.

Advantageous Effects of Invention

Efficiency can be improved in releasing light from a light-emitting layer.

BRIEF DESCRIPTION OF DRAWINGS

FIG. 7(*a*) is a graph showing an exemplary test result illustrating variations in light releasing efficiency, the variations being observed when a total thickness of a first electrode and a nanoparticle layer in FIG. 4 is changed. FIG.

7(b) shows a specific exemplary configuration of a nanoparticle layer for each of red, green and blue light-emitting elements.

Figure 8:
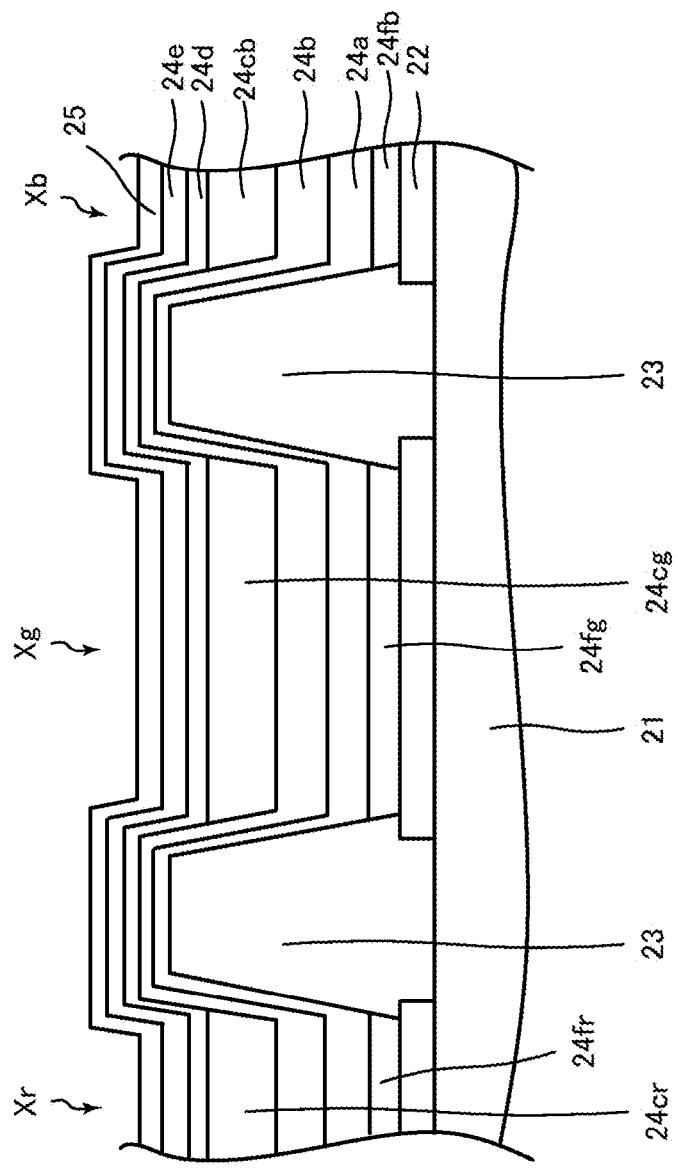

FIG. 8 is a cross-sectional view of a first modification of the display device.

FIG. 9 illustrates an essential configuration of a second modification of the display device. FIG. 9(a) is a perspective view of a specific configuration of a second electrode in the second modification. FIG. 9(b) is a drawing illustrating a specific configuration of a light-emitting-element layer in the second modification. FIG. 9(c) is a graph showing an advantageous effect of the second modification.

Figure 10:
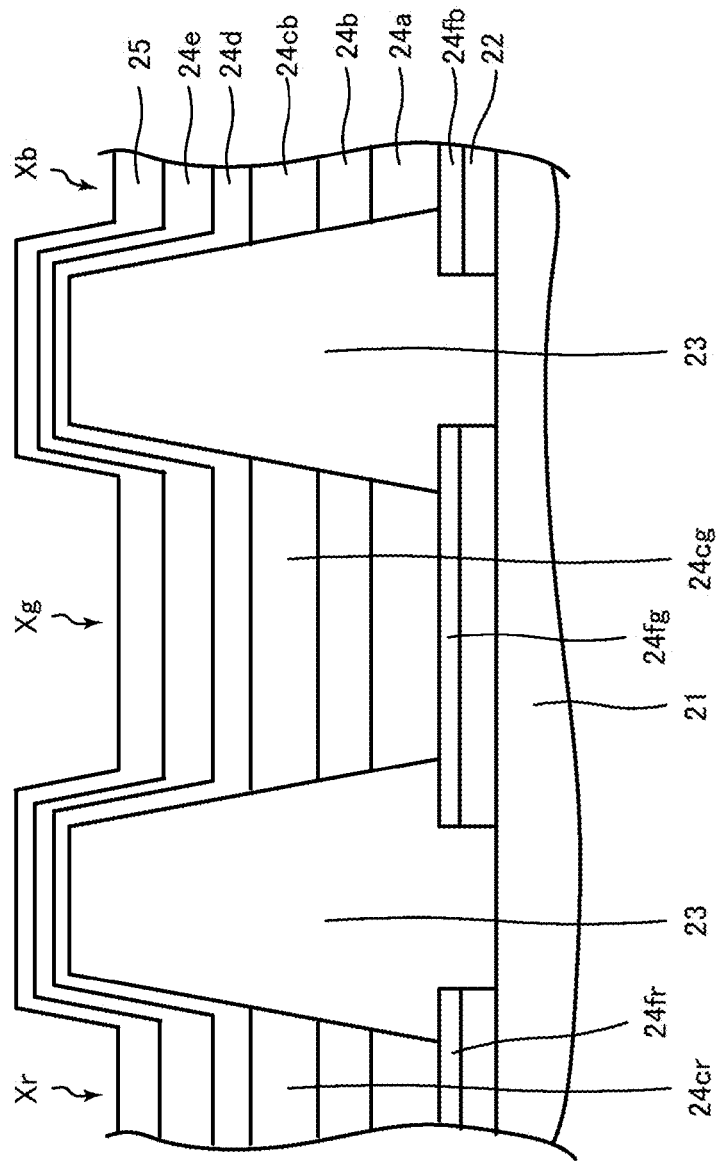

FIG. 10 is a cross-sectional view of a third modification of the display device.

Figure 11:
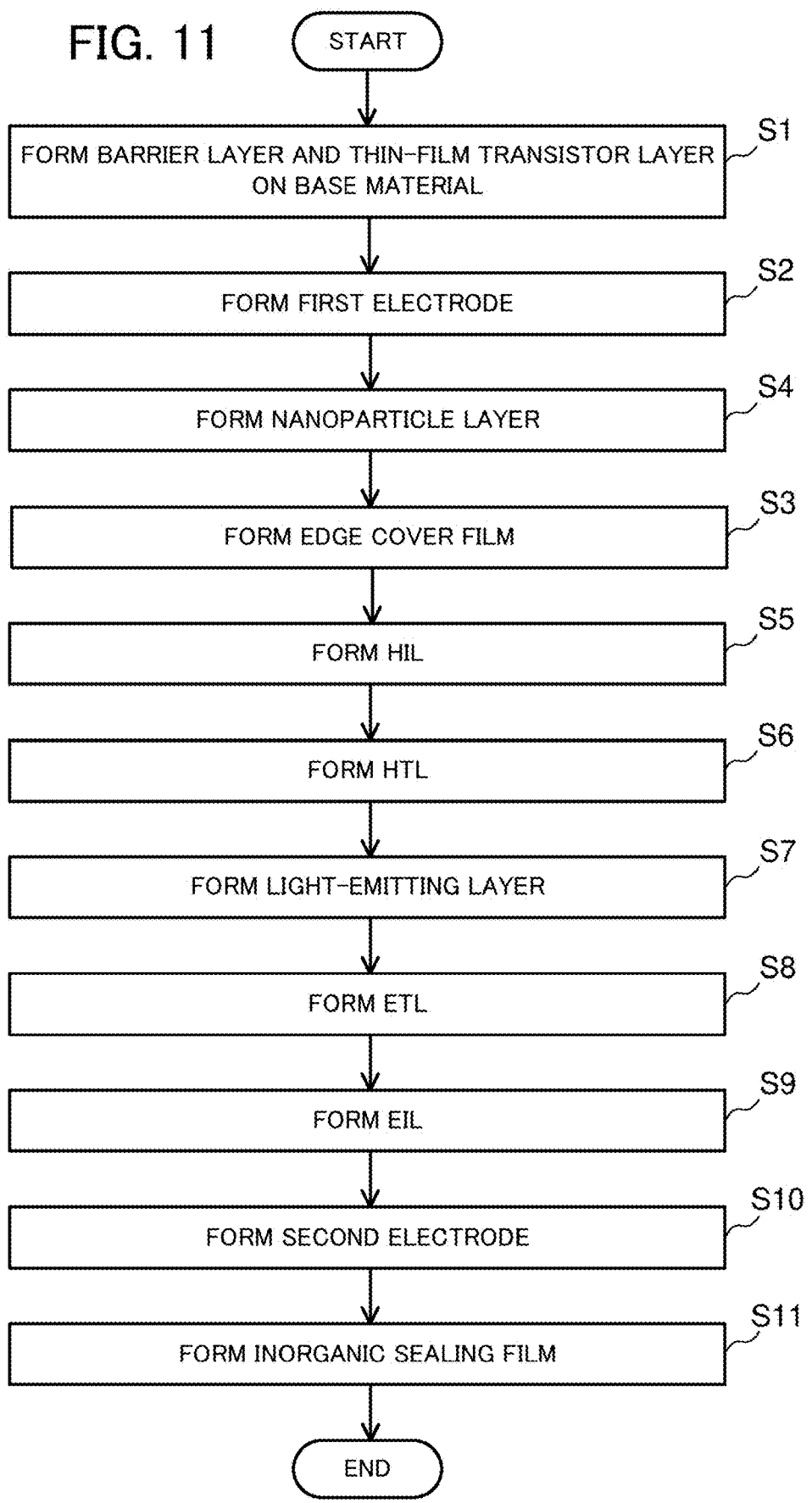

FIG. 11 is a flowchart showing a method for producing the display device illustrated in FIG. 10.

Figure 12:
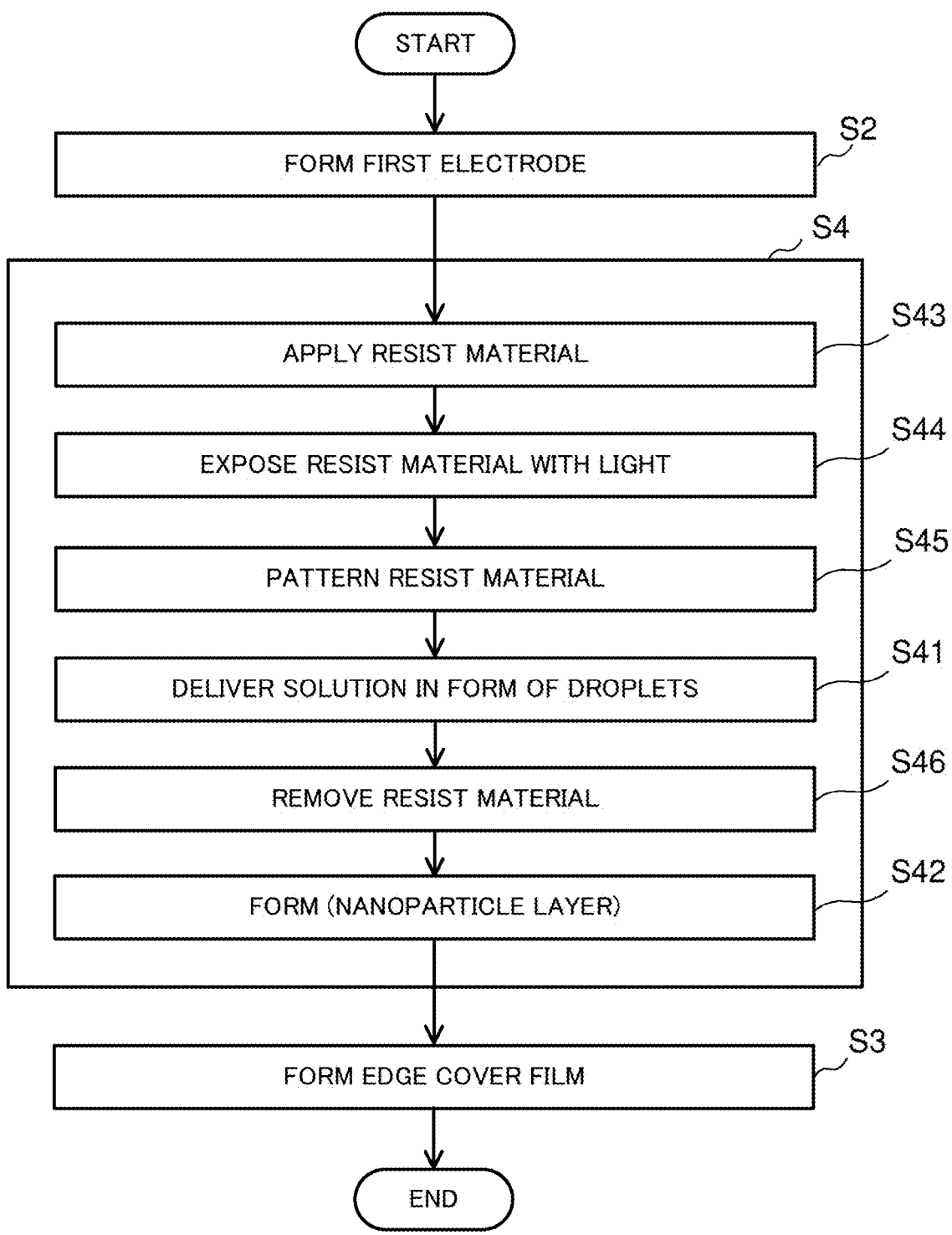

FIG. 12 is a flowchart specifically showing a method for producing essential features of the display device illustrated in FIG. 10.

Figure 13:
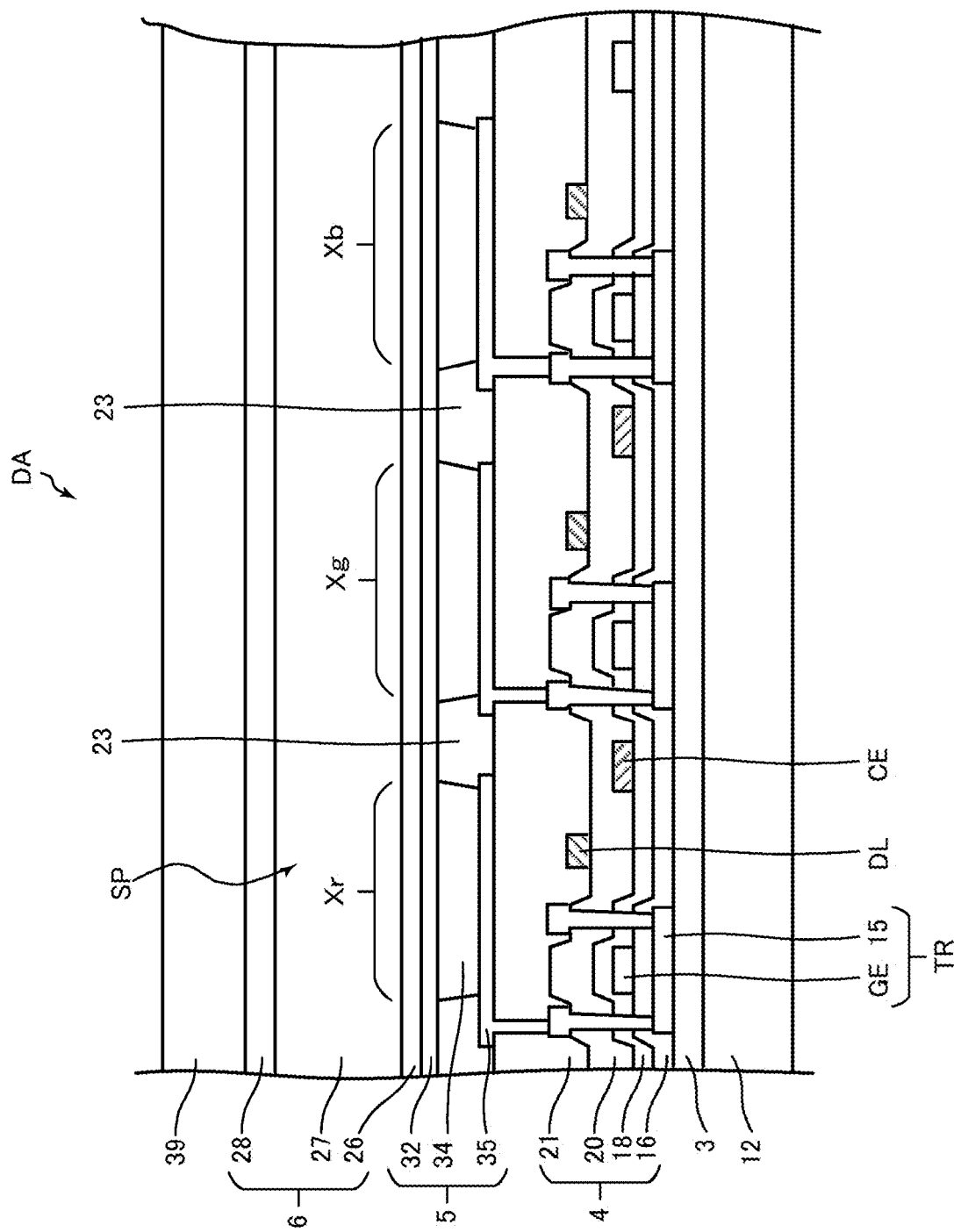

FIG. 13 is a cross-sectional view of an essential configuration of a display device according to a second embodiment of the disclosure.

Figure 14:
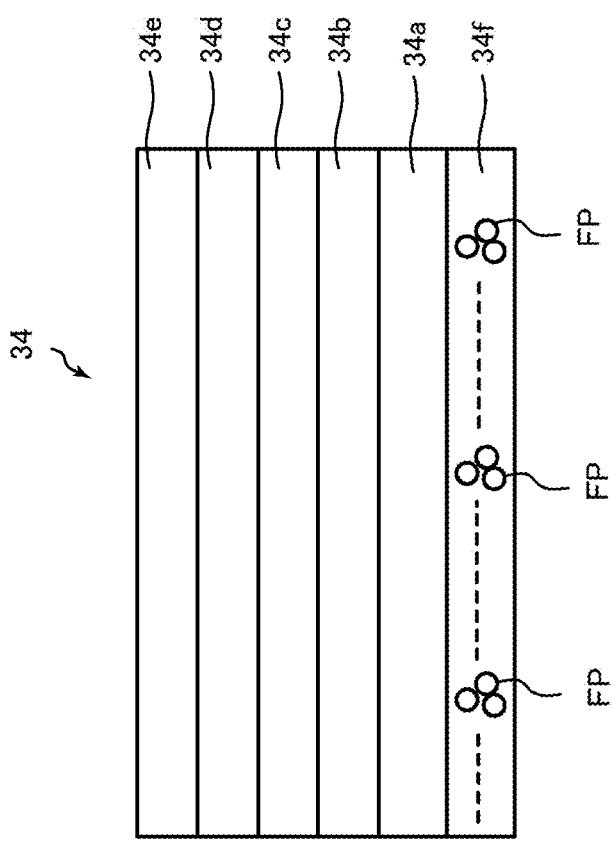

FIG. 14 is a cross-sectional view of a specific configuration of a functional layer illustrated in FIG. 13.

Figure 15:
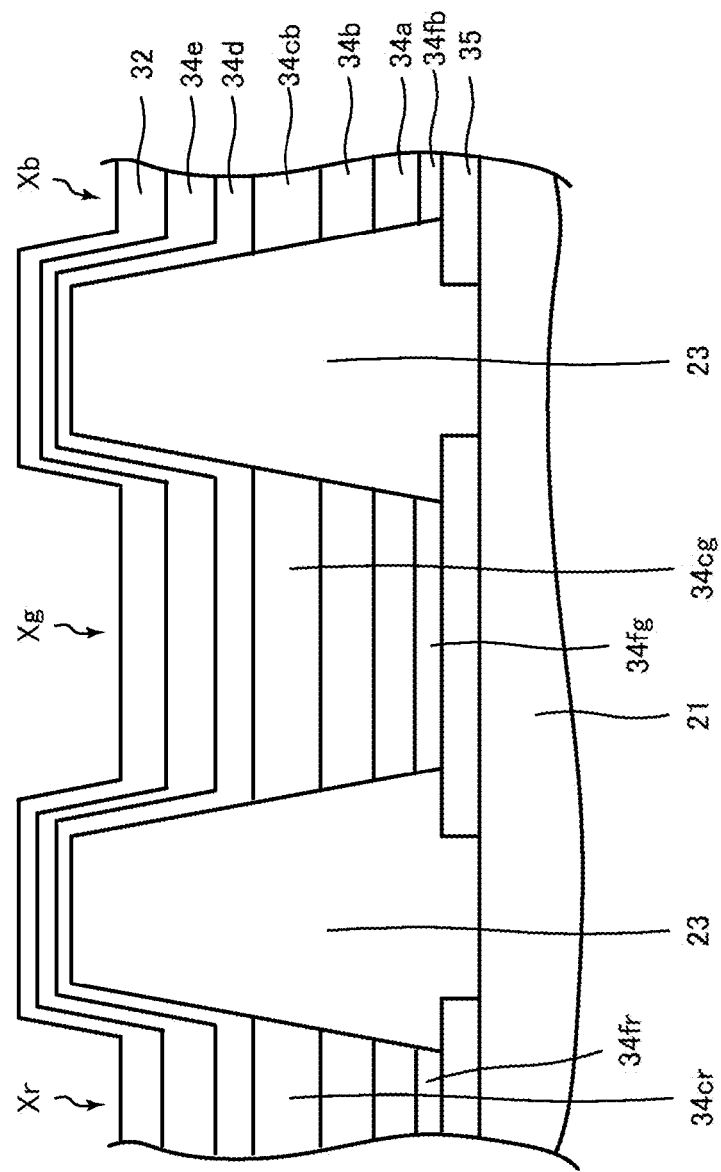

FIG. 15 is a cross-sectional view of a specific exemplary configuration of light-emitting elements illustrated in FIG. 13.

Figure 16:
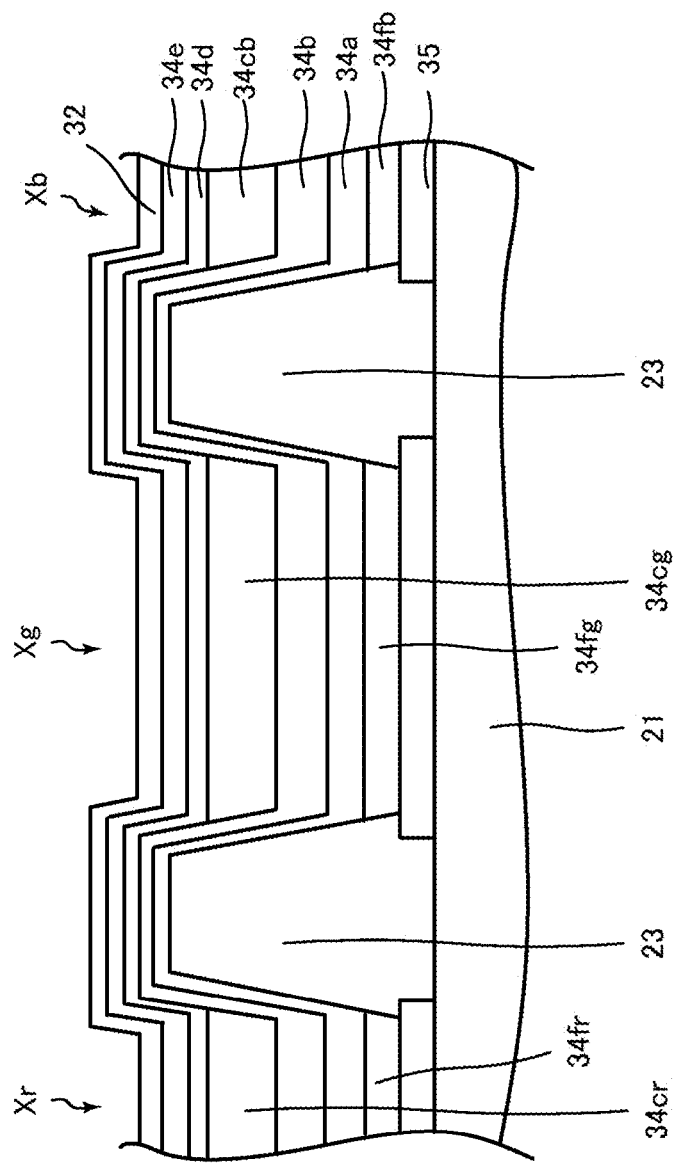

FIG. 16 is a cross-sectional view of a first modification of the display device illustrated in FIG. 13.

Figure 17:
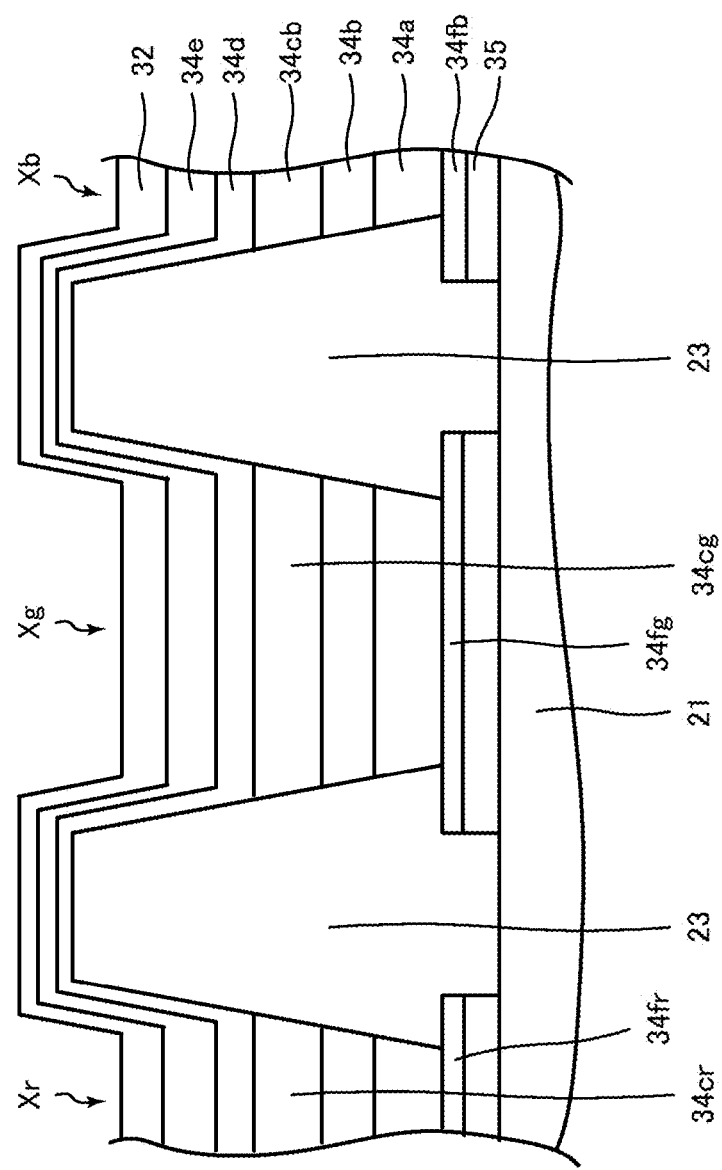

FIG. 17 is a cross-sectional view of a second modification of the display device illustrated in FIG. 13.

DESCRIPTION OF EMBODIMENTS

Embodiments of the present invention will be described below in detail, with reference to the drawings. Note that the present invention shall not be limited to the embodiments below. Moreover, in the description below, the term "same layer" means that constituent features are formed in the same process (in the same film forming process). The term "layer below" means that a constituent feature is formed in a previous process before a comparative layer. The term "layer above" means that a constituent feature is formed in a successive process after a comparative layer. Furthermore, the dimensions of the constituent features in each of the drawings do not represent, for example, exact dimensions of the actual constituent features or exact dimensional proportions of the constituent features.

First Embodiment

Figure 1:
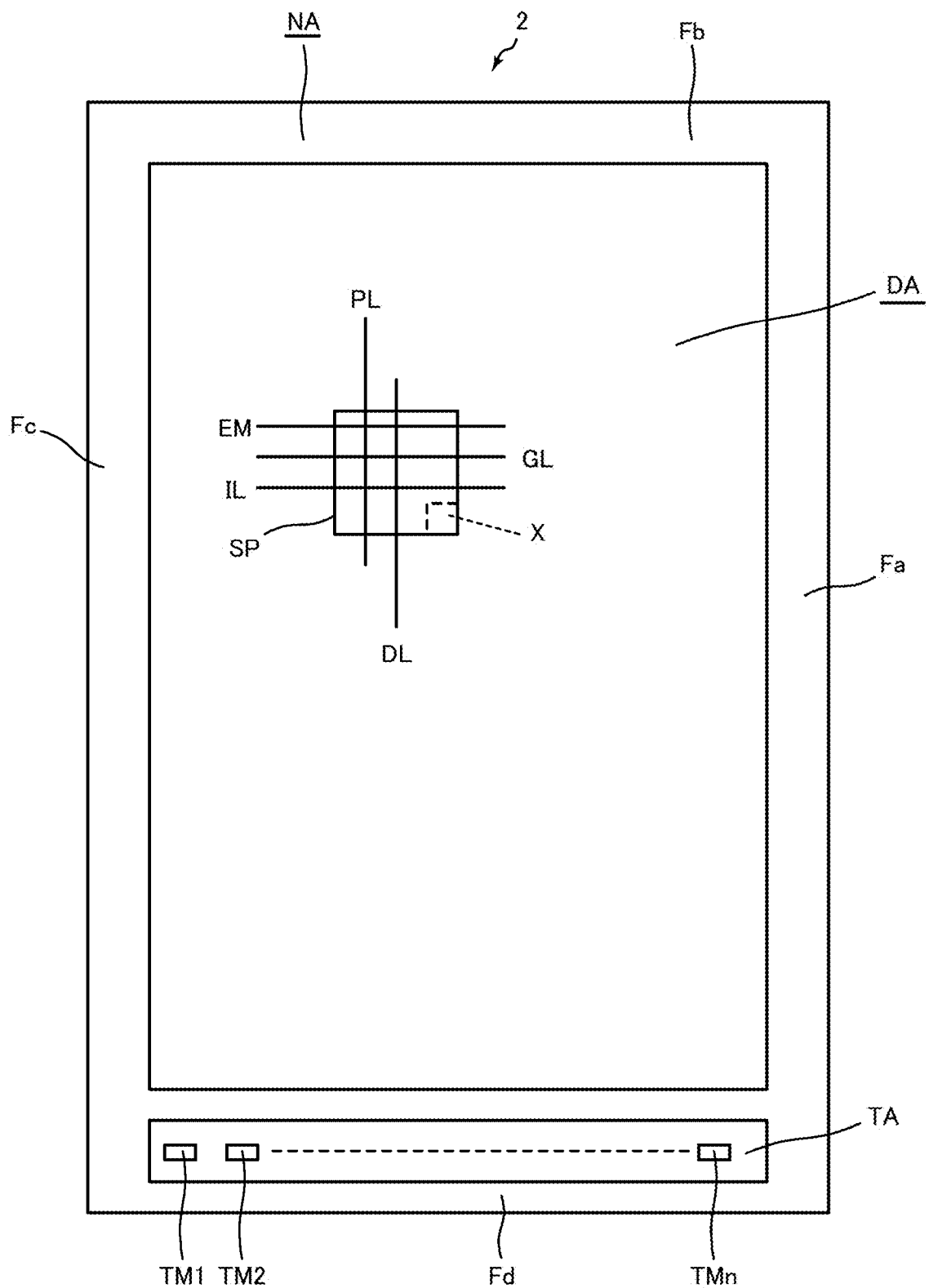
FIG. 1 is a schematic view of a configuration of a display device according to a first embodiment of the disclosure.
Figure 2:
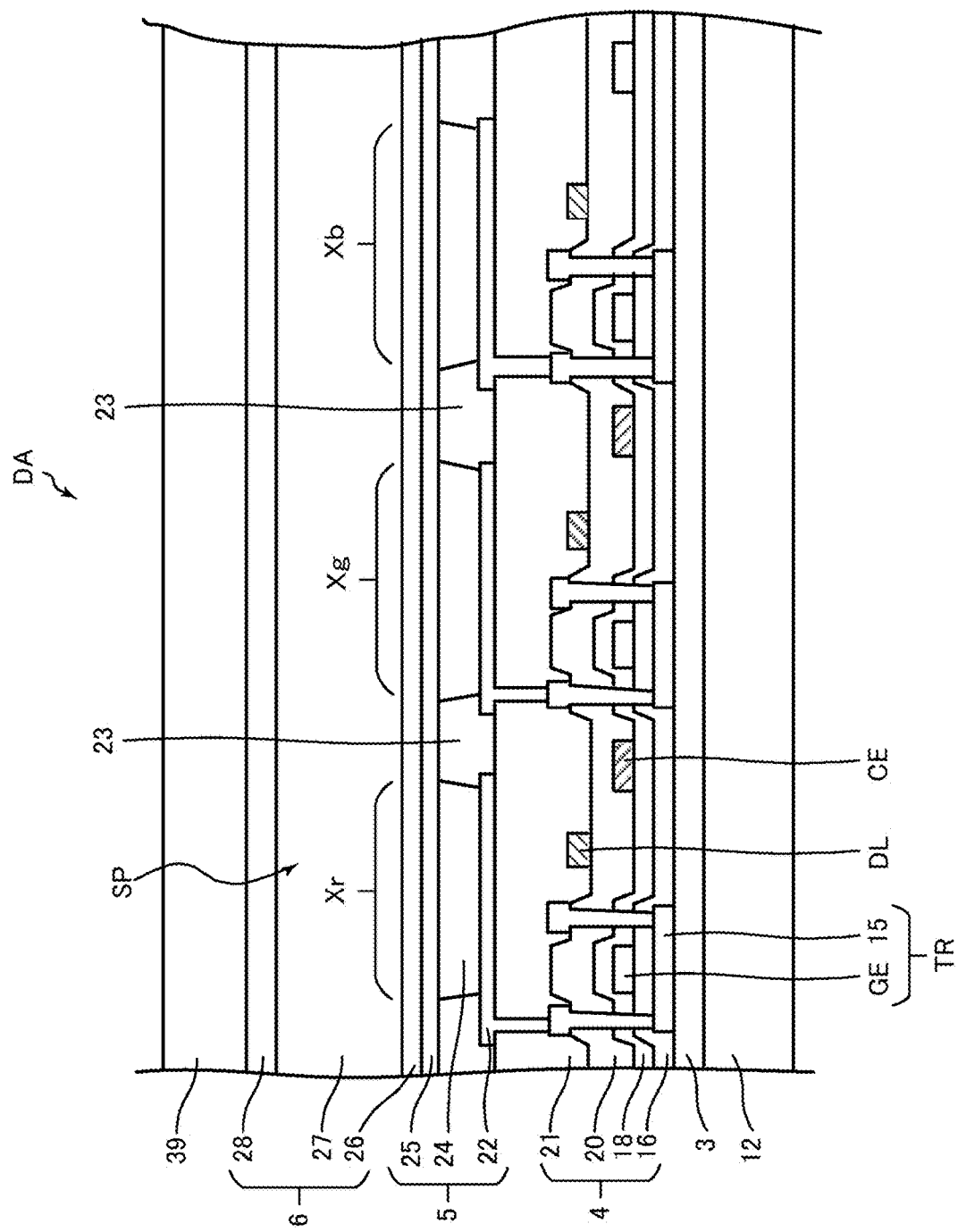
FIG. 2 is a cross-sectional view of an essential configuration of the display device illustrated in FIG. 1.
Figure 3:
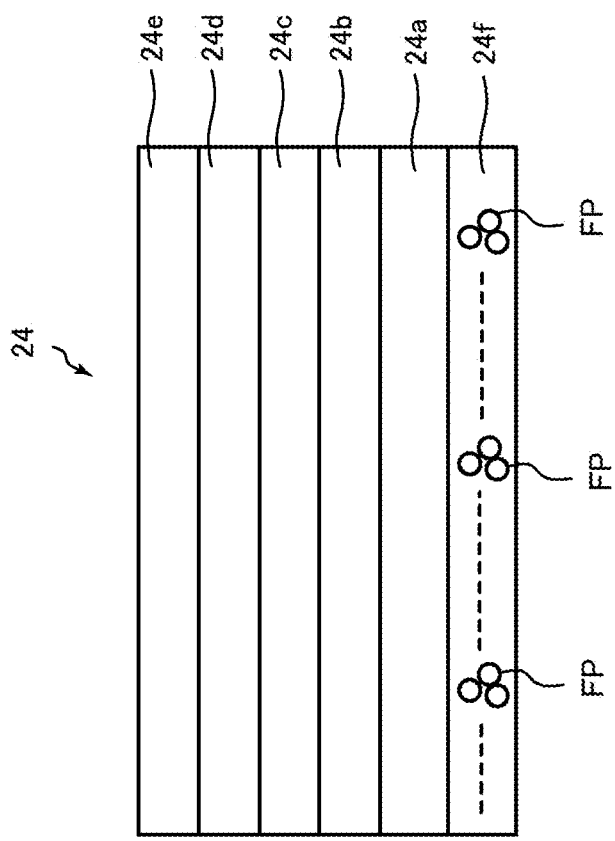
FIG. 3 is a cross-sectional view of a specific configuration of a functional layer illustrated in FIG. 2.
Figure 4:
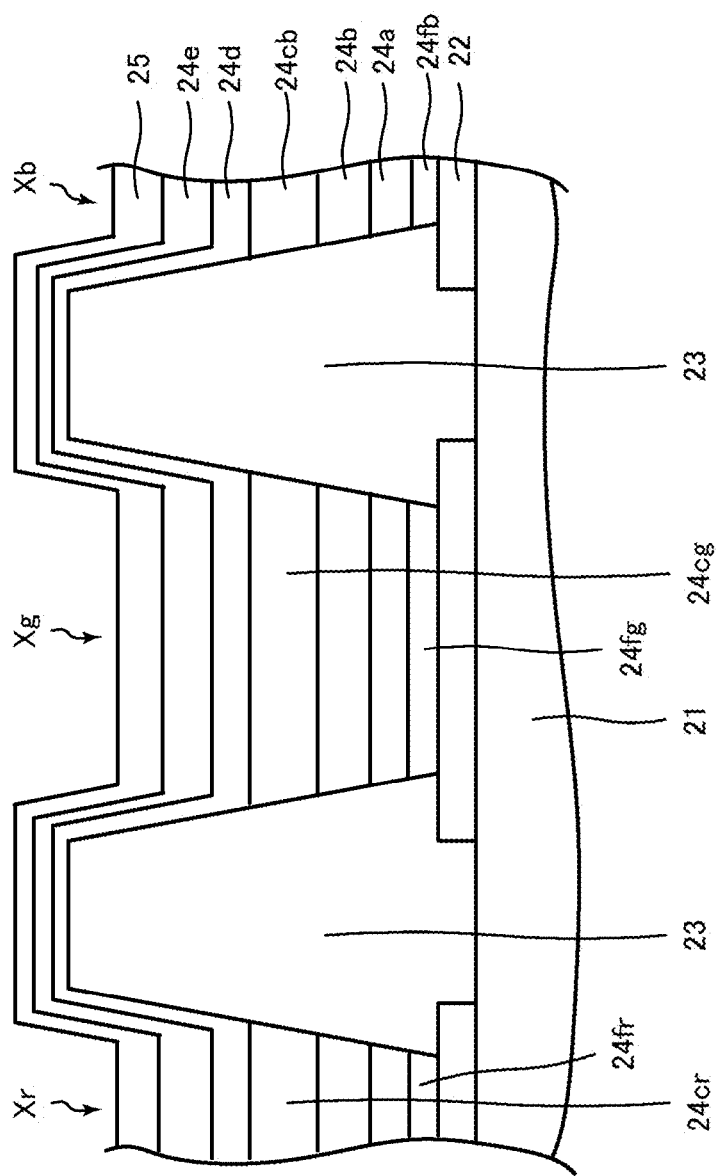
FIG. 4 is a cross-sectional view of a specific exemplary configuration of light-emitting elements illustrated in FIG. 2.

FIG. 1 is a schematic view of a configuration of a display device according to a first embodiment of the disclosure. FIG. 2 is a cross-sectional view of an essential configuration of the display device illustrated in FIG. 1. FIG. 3 is a cross-sectional view of a specific configuration of a functional layer illustrated in FIG. 2. FIG. 4 is a cross-sectional view of a specific exemplary configuration of light-emitting elements illustrated in FIG. 2.

As illustrated in FIGS. 1 and 2, a display device 2 according to this embodiment includes: a barrier layer 3; a thin-film transistor (TFT) layer 4; a light-emitting-element layer 5 of a top-emission type; and a sealing layer 6, all of which are provided on a base material 12 in the stated order. A display region DA includes a plurality of sub-pixels SP. A frame region NA surrounding the display region DA has four edges Fa to Fd. On the edge Fd, a terminal unit TA is formed to mount an electronic circuit board (such as an IC chip and an FPC). The terminal unit TA includes a plurality of terminals TM1, TM2, and TMn (n is an integer of 2 or more). These plurality of terminals TM1, TM2, and TMn are provided along one of the four edges of the display region DA, as illustrated in FIG. 1. Note that, on each of the edges Fa to Fd, a driver circuit (not shown) can be formed.

The base material 12 may be either a glass substrate, or a flexible substrate including a resin film made of, for example, polyimide. Moreover, the base material 12 may be a flexible substrate made of two resin films and an inorganic insulating film sandwiched between these two resin films. Furthermore, to a lower surface of the base material 12, a film made of, for example, PET may be attached. In addition, if the base material 12 is a flexible substrate, the display device 2 to be formed can be a flexible one.

The barrier layer 3 keeps the thin-film layer 4 and the light-emitting-element layer 5 from such foreign objects as water and oxygen. The barrier layer 3 can be, for example, a silicon oxide film, a silicon nitride film, or a silicon oxide nitride film formed by chemical vapor deposition (CVD). Alternatively, the barrier layer 3 can be formed of a multilayer film including these films.

As illustrated in FIG. 2, the thin-film transistor layer 4 includes: a semiconductor layer (including a semiconductor film 15) above the barrier layer 3; an inorganic insulating film 16 (a gate insulating film) above the semiconductor layer; a first metal layer (including a gate electrode GE) above the inorganic insulating film 16; an inorganic insulating film 18 above the first metal layer; a second metal layer (including a capacitive electrode CE) above the inorganic insulating film 18; an inorganic insulating film 20 above the second metal layer; a third metal layer (including a data signal line DL) above the inorganic insulating film 20; and a planarization film 21 above the third metal layer.

The above semiconductor layer is formed of, for example, amorphous silicon, low temperature polysilicon (LTPS), or oxide semiconductor. A thin-film transistor TR is formed to include the gate electrode GE and the semiconductor film 15.

Note that, in this embodiment, the thin-film transistor TR is, for example, a top-gate thin-film transistor. Alternatively, the thin-film transistor TR may be a bottom-gate thin-film transistor.

In the display region DA, a light-emitting element X and a control circuit of the light-emitting element X are provided for each of the sub-pixels SP. The thin-film layer 4 includes this control circuit and wires connecting to the control circuit. Examples of the wires to connect to the control circuit include: a scan signal line GL and a light-emission control line EM formed in the first metal layer; an initialization power supply line IL formed in the second metal layer; and a data signal line DL and a high-voltage power supply line PL formed in the third metal layer. The control circuit includes such transistors as: a drive transistor to control a current of the light-emitting element X; a write transistor to electrically connect to the scan signal line; and a light-emission control transistor to electrically connect to the light-emission control line (not shown).

Each of the first metal layer, the second metal layer, and the third metal layer is a monolayer metal film made of at least one of such a metal as, for example, aluminum, tungsten, molybdenum, tantalum, chromium, titanium, or copper. Alternatively, each metal layer is a multilayer metal film formed of these metals.

Each of the inorganic insulating films 16, 18, and 20 can be, for example, a silicon oxide ($SiO_x$) film or a silicon nitride (SiN$_x$) film formed by the CVD. Alternatively, each of the inorganic insulating films 16, 18, and 20 can be a multilayer film including these films. The planarization film 21 can be made of, for example, an applicable organic material such as polyimide or acrylic resin.

The light-emitting-element layer 5 includes: a first electrode (an anode) 22 above the planarization film 21; an edge cover film 23 having insulating properties and covering an edge of the first electrode 22; a functional layer 24 above the edge cover film 23; and a second electrode (a cathode) 25 above the functional layer 24. That is, the light-emitting element layer 5 includes a plurality of the light-emitting elements X. Each of the light-emitting elements X includes: the first electrode 22; a light-emitting layer included in the functional layer 24; and the second electrode 25. The light-emitting elements X emit light in different colors. The light-emitting layer will be described later. The edge cover film 23 is formed of, for example, an organic material such as polyimide or acrylic resin. The organic material is applied, and after that, patterned by photolithography to form the edge cover film 23. Moreover, this edge cover film 23 overlaps with an edge portion of a surface of the first electrode 22 shaped into an island, and defines a pixel (a sub-pixel SP). The edge cover film 23 is a bank to separate the plurality of pixels (the sub-pixels SP) from each other for a corresponding one of the plurality of light-emitting-elements X. Furthermore, the functional layer 24 is an electroluminescence (EL) layer including an EL element.

In the light-emitting-element layer 5, the light-emitting-elements X include: a light-emitting element Xr (red); a light-emitting element Xg (green); and a light-emitting element Xb (blue) formed to emit light in different colors. Moreover, each of the light-emitting elements X includes: the first electrode 22; the functional layer 24 (including the light-emitting layer); and the second electrode 25. The first electrode 22 is an electrode shaped into an island and provided for each of the light-emitting elements X (i.e. each of the sub-pixels SP). The second electrode 25 is a monolithic common electrode in common among all the light-emitting elements X.

The light-emitting elements Xr, Xg, and Xb may be either, for example, organic light-emitting diodes (OLEDs) so that the light-emitting layer to be described later is an organic light-emitting layer, or quantum-dot light-emitting diodes (QLEDs) so that the light-emitting layer is a quantum-dot light-emitting layer.

The functional layer 24 includes, for example: a nanoparticle layer 24f; a hole-injection layer 24a; a hole-transport layer 24b; a light-emitting layer 24c; an electron-transport layer 24d; and an electron-injection layer 24e, all of which are stacked on top of another in the stated order from below. Moreover, the functional layer 24 may be provided with an electron-blocking layer and a hole-blocking layer. The light-emitting layer 24c is formed of droplets delivered and applied by such a technique as spin-coating or ink-jet printing. After that, the applied droplets are patterned to form the light-emitting layer 24c shaped into islands. The other layers are shaped into either islands or monolithic forms. Moreover, the functional layer 24 may omit one or more of the hole-injection layer 24a, the hole-transport layer 24b, the electron-transport layer 24d, and the electron-injection layer 24e. Furthermore, in this embodiment, the hole-injection layer 24a and the hole-transport layer 24b are respectively a charge-injection layer and a charge-transport layer provided between the nanoparticle layer 24f and the light-emitting layer 24c.

The display device 2 of this embodiment, illustrated in FIG. 2 as an example, has a so-called known structure including anodes (the first electrodes 22), the functional layers 24, and a cathode (the second electrode 25) provided in the stated order from toward the thin-film-transistor layer 4.

Moreover, as illustrated in FIG. 4, the display device 2 of this embodiment has the light-emitting elements Xr, Xg, and Xb separated from one another by the edge cover film 23 serving as a bank. For each of the light-emitting elements X, the first electrode 22, nanoparticle layers 24fr, 24fg, and 24fh (collectively referred to as the nanoparticle layer 24f), the hole-injection layer 24a, the hole-transport layer 24b, and light-emitting layers 24cr, 24cg, and 24cb (collectively referred to as the light-emitting layer 24c) are provided in shapes of islands. Furthermore, the light-emitting elements X are provided with the electron-transport layer 24d, the electron-injection layer 24e, and the second electrode 25, each of which is provided monolithically in common among all the sub-pixels SP.

If an organic light-emitting layer (the light-emitting layer 24c) of an OLED is formed by vapor deposition, a fine metal mask (FMM) is used. The FMM is a sheet (made of, for example, invar) having many through holes. Organic material passing through one through hole forms a light-emitting layer (corresponding to one sub-pixel SP) shaped into an island. Otherwise, the organic light-emitting layer (the light-emitting layer 24c) of an OLED may be formed of a predetermined solution delivered in droplets.

If each of the light-emitting elements Xr, Xg and Xb is an OLED, holes and electrons recombine together in the light-emitting layer 24c by a drive current between the first electrode 22 and the cathode 25, which forms an exciton. While the exciton transforms to the ground state, light is released. Because the second electrode 25 is highly light-transparent and the first electrode 22 is light-reflective, the light released from the functional layer 24 travels upwards. This is how the light-emitting-element layer 5 is of a top emission type.

A quantum-dot light-emitting layer (the light-emitting layer 24c) of a QLED is formed of, for example, a solution containing a solvent and quantum dots dispersed in the solvent. The solution is applied and then patterned by photolithography to form a light-emitting layer (corresponding to one sub-pixel SP) shaped into an island.

Moreover, if each of the light-emitting elements Xr, Xg, and Xb is a QLED, holes and electrons recombine together in the light-emitting layer 24c by a drive current between the first electrode 22 and the second electrode 25, which forms an exciton. While the exciton transforms from the conduction band level to the valence band level of the quantum dots, light (fluorescence) is released.

The light-emitting-element layer 5 may include a light-emitting element such as, for example, an inorganic light-emitting diode other than the OLED and the QLED.

Furthermore, described below is an example in which the light-emitting layer 24c is a quantum-dot light-emitting layer containing quantum dots. That is, in the display device 2 of this embodiment, the light-emitting element Xr in red includes a red quantum-dot light-emitting layer that emits a red light, the light-emitting element Xg in green includes a green quantum-dot light-emitting layer that emits a green light, and the light-emitting element Xb in blue includes a blue quantum-dot light-emitting layer that emits a blue light.

The quantum-dot light-emitting layer (the light-emitting layer 24c) contains quantum dots serving as a functional material contributing to a function of the light-emitting layer 24c. The light-emitting layers 24cr, 24cg, and 24cb in respective colors contain quantum dots in at least different particle sizes, depending on emission spectra of the light-emitting layers 24cr, 24cg, and 24cb.

The first electrode (the anode) 22 is a light-reflective multilayer made of, for example, indium tin oxide (ITO), indium zinc oxide (IZO), and one of silver (Ag), Al, or an alloy containing Ag and Al. The second electrode (the cathode) 25 is a transparent electrode formed of such a light-transparent conductive material as, for example: a thin film made of Ag, Au, Pt, Ni, Ir. or Al; a thin film made of a MgAg alloy; ITO; or indium zinc oxide (IZO). Note that, otherwise, the second electrode 25 may be formed of metal nanowires, using such a metal as, for example, silver. If such metal nanowires are used to form the second electrode 25, which is a common electrode shaped monolithically and provided upwards, a solution containing the metal nanowires can be applied to form the second electrode 25. As a result, as to the light-emitting-element layer 5 of the display device 2, a predetermined solution to be delivered in droplets can be used to form, other than the first electrode 22, each of the layers in the functional layer 24 and the second electrode 25. Hence, the display device 2 can be produced in a simple manner.

The nanoparticle layer 24f contains metal-oxide nanoparticles that are electrically conductive. The metal oxide nanoparticles are formed of the same metal oxide as that of, for example, the first electrode 22. Specifically, the metal oxide nanoparticles are ITO nanoparticles FP (FIG. 3). Thus, the nanoparticle layer 24f is formed of nanoparticles of the same metal oxide as the metal oxide used for the first electrode 22. Such a feature can readily improve adhesion between the first electrode 22 and the nanoparticle layer 24f. Moreover, the feature can readily improve efficiency in injecting (releasing) charges (holes) from the first electrode 22 to the nanoparticle layer 24f, and accordingly improve efficiency in releasing light from the light-emitting layer 24c. Note that the ITO nanoparticles FP have a particle size ranging from, for example, 10 to 100 nm.

Moreover, the nanoparticle layer 24f has a thickness of 15 nm or more and 600 nm or less. Such a feature can improve efficiency in releasing light from the light-emitting layer 24c, and keep the nanoparticle layer 24f from having high resistance. (Details will be described later). Furthermore, the nanoparticle layer 24f varies in thickness for each of the light-emitting elements Xr, Xg, and Xb. That is, as will be described later, the nanoparticle layers 24fr, 24fg, and 24fb have different thicknesses to optimize the above light emission efficiency for each of red, green and blue. In addition, as will be illustrated in FIG. 7(b) later as an example, the nanoparticle layer 24f may be provided to at least one of the light-emitting elements Xr, Xg, and Xb among the light-emitting elements X. The nanoparticle layer 24f can be omitted from a light-emitting element for one color or light-emitting elements for two colors; that is, the nanoparticle layer 24f can be omitted from one or two of the light-emitting elements Xr, Xg, and Xb representing three colors of RGB. (That is, the nanoparticle layer 24f may be provided to just one light-emitting element X for one color.)

The sealing layer 6, which is light-transparent, includes: an inorganic sealing film 26 directly formed on the second electrode 25 (formed in contact with the second electrode 25); an organic film 27 above the inorganic sealing film 26; and an inorganic sealing film 28 above the organic film 27. The sealing layer 6 covers the light-emitting-element layer 5 to keep such foreign objects as water and oxygen from penetrating into the light-emitting element layer 5. Note that, if the light-emitting layer 24c is a quantum-dot light-emitting layer, the sealing layer 6 can be omitted.

The organic film 27, which is transparent to light, has a planarization effect. The organic film 27 can be formed of an applicable organic material by, for example, ink-jet printing. The inorganic sealing films 26 and 28 are inorganic insulating films. Each of the inorganic sealing films 26 and 28 can be, for example, a silicon oxide film, a silicon nitride film, or a silicon oxide nitride film formed by the CVD. Alternatively, each of the inorganic sealing films 26 and 28 can be formed of a multilayer film including these films.

The functional film 39 has at least one of, for example, an adaptive optics correction function, a touch sensor function, and a protection function.

Figure 5:
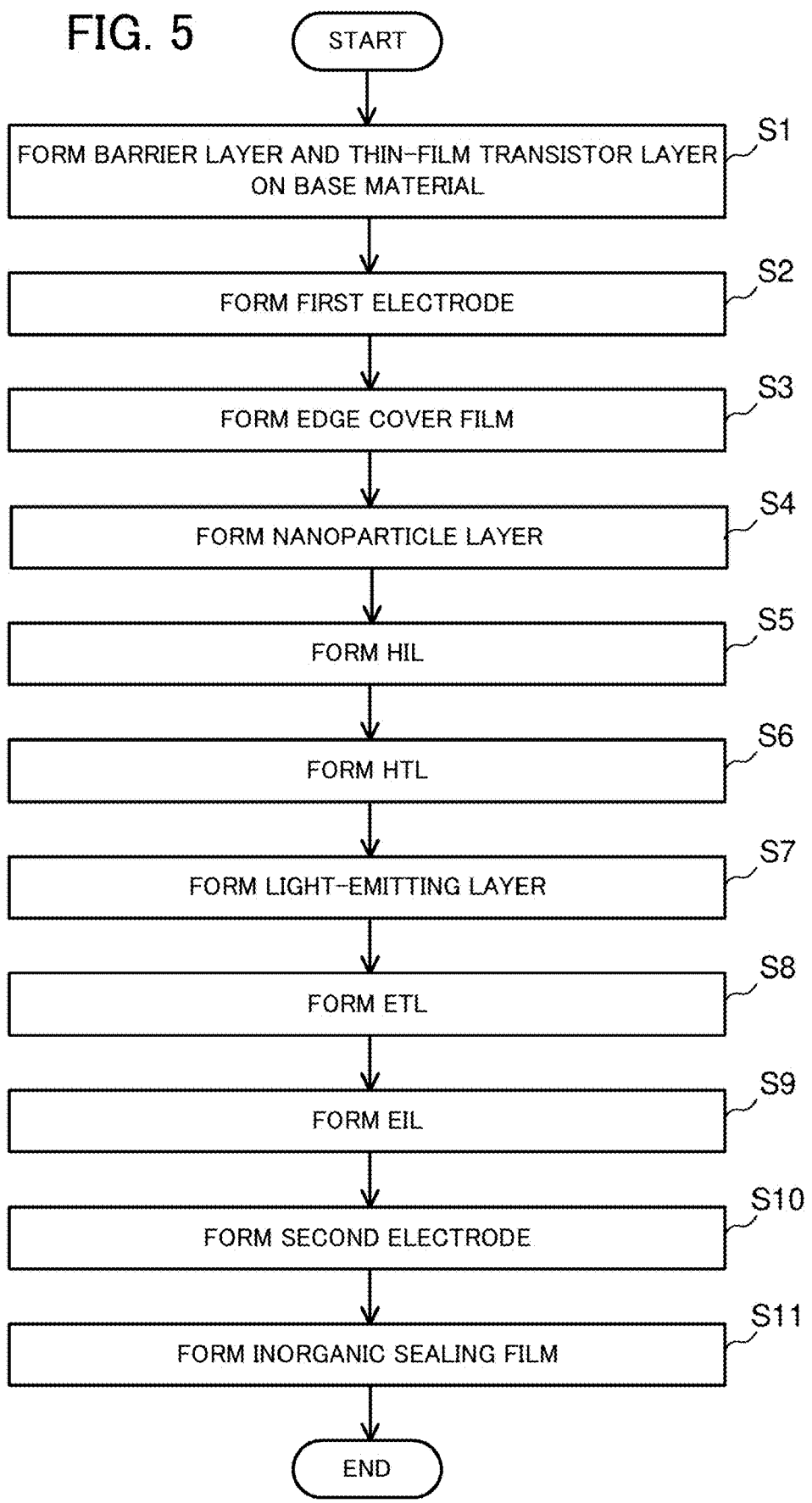
FIG. 5 is a flowchart showing a method for producing the display device.

Next, also with reference to FIG. 5, a method for producing the display device 2 of this embodiment is specifically described. FIG. 5 is a flowchart showing a method for producing the display device.

As illustrated in FIG. 5, in the method for producing the display device 2 of this embodiment, first, the barrier layer 3 and the thin-film transistor layer 4 are formed on the base material 12 (Step S1). Next, for example, utilizing sputtering and photolithography, the first electrode (the anode) 22 is formed on the planarization film 21 (Step S2). At this first electrode forming step, a first electrode 22 is formed for each of the plurality of light-emitting elements X. Then, the edge cover film 23 is formed (Step S3).

Next, the nanoparticle layer 24f is formed of droplets delivered by such a technique as ink-jet printing (Step S4).

Figure 6:
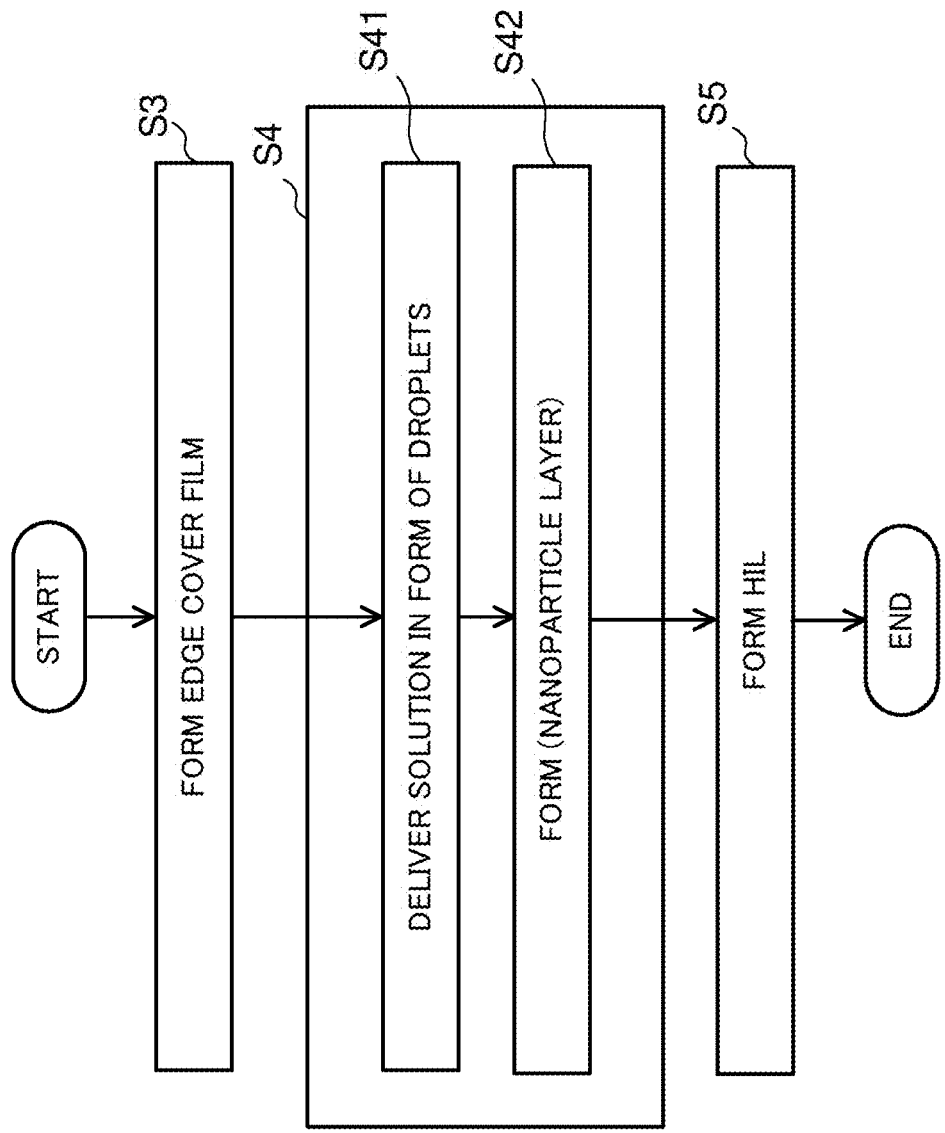
FIG. 6 is a flowchart specifically showing a method for producing essential features of the display device.

Here, also with reference to FIG. 6, a nanoparticle layer forming step is described in detail. FIG. 6 is a flowchart specifically showing a method for producing essential features of the display device.

At this nanoparticle layer forming step, as seen at Step S41 in FIG. 6, a solution droplet delivering step is carried out to deliver a solution in the form of droplets onto a surface of the first electrode 22. The solution contains metal-oxide nanoparticles that are electrically conductive. At the solution droplet delivering step of this embodiment, the solution is delivered by ink-jet printing in the form of droplets onto the surface of the first electrode 22 for each of the light-emitting elements X. Specifically, at this nanoparticle layer forming step, examples of a solvent contained in the nanoparticle layer forming solution (the above solution) include: hexane; toluene; tetradecane; cyclododecane; ethanol; isopropyl alcohol; ethylene glycol; polyethylene glycol; propylene glycol monomethyl ether; acetone; THF, NMP, and water. Moreover, a substance; that is, the metal oxide nanoparticles (a functional material) dissolved into the nanoparticle layer forming solution is, for example, the ITO nanoparticles FP.

Next, at the nanoparticle layer forming step, as seen at Step S42 in FIG. 6, the nanoparticle layer forming step is carried out to form the nanoparticle layer 24f made of the solution delivered in the form of droplets. The nanoparticle layer 24f contains the ITO nanoparticles (the metal oxide nanoparticles) FP. Specifically, for example, the above nanoparticle layer forming solution is delivered in the form of droplets onto the first electrode 22, and baked at a predetermined temperature under vacuum environment. Hence, the nanoparticle layer 24f having the thickness of 14 to 600 nm is formed for each of the light-emitting elements Xr, Xg, and Xb.

Note that if the nanoparticle layer 24f has a thickness of less than 15 nm, the resistance value of the nanoparticle layer 24f is high, which might block a flow of the holes (charges) from the first electrode 22. Whereas, if the nanoparticle layer 24f has a thickness of more than 600 nm, the nanoparticle layer 24f is less likely to be deposited, which might block formation of the nanoparticle layer 24f and cause the resulting decrease in productivity of the display device 2.

Returning to FIG. 5, the hole-injection layer (the HIL) 24a is formed of droplets delivered by such a technique as ink-jet printing (Step S5). Specifically, at this hole-injection-layer forming step, examples of a solvent contained in the hole-injection-layer forming solution include: ethanol; 2-propanol; ethylene glycol; polyethylene glycol; butyl benzoate; toluene; chlorobenzene; tetrahydrofuran; and 1,4-dioxane. Moreover, a substance; that is, a hole-injection material (a functional material) dissolved in the hole-injection-layer forming solution is, for example: a polythiophene-based conductive material such as PEDOT: PSS; or an inorganic compound such as nickel oxide or tungsten oxide. Then, at this HIL forming step, the hole-injection-layer forming solution is delivered in the form of droplets on the first electrode 22, and baked at a predetermined temperature. Hence, the hole-injection layer 24a is formed to have a thickness of, for example, 20 to 50 nm.

Note that, if the light-emitting elements Xr, Xg, and Xb are OLEDs, examples of a hole-injection material (a functional material) for the hole-injection-layer forming solution can include the above materials, and additionally include, for example: benzene, styrylamine, triphenylamine, porphyrin, triazole, imidazole, oxadiazole, polyaryl alkane, phenylenediamine, allylamine, oxazole, anthracene, fluorenone, hydrazone, stilbene, triphenylene, and azatriphenylene; a derivative of these materials; and a chain-conjugated organic polymer such as a polysilane-based compound, a vinylcarbazole-based compound, a thiophene-based compound, or an aniline-based compound.

Next, the hole-transport layer (the HTL) 24b is formed of droplets delivered by such a technique as ink-jet printing (Step S6). Specifically, at this hole-transport-layer forming step, examples of a solvent contained in the hole-transport-layer forming solution include: chlorobenzene; toluene; tetrahydrofuran; 1,4-dioxane; propylene glycol monomethyl ether acetate (PGMEA); ethanol; 2-propanol; ethylene glycol; polyethylene glycol; and butyl benzoate. Moreover, a substance; that is, a hole-transport material (a functional material) dissolved in the hole-transport-layer forming solution is, for example: an organic polymeric compound such as TBF, PVK, or poly-TPD; or an inorganic compound such as nickel oxide. Then, at this HTL forming step, the hole-transport-layer forming solution is delivered in the form of droplets on the hole-injection layer 24a, and baked at a predetermined temperature. Hence, the hole-transport layer 24b is formed to have a thickness of, for example, 20 to 50 nm.

Note that, if the light-emitting elements Xr, Xg, and Xb are OLEDs, examples of a hole-transport material (a functional material) for the hole-transport-layer forming solution can include the above materials, and additionally include, for example: benzene, styrylamine, triphenylamine, porphyrin, triazole, imidazole, oxadiazole, polyaryl alkane, phenylenediamine, allylamine, oxazole, anthracene, fluorenone, hydrazone, stilbene, triphenylene, and azatriphenylene; a derivative of these materials; and a chain-conjugated organic polymer such as a polysilane-based compound, a vinylcarbazole-based compound, a thiophene-based compound, or an aniline-based compound.

Next, the light-emitting layer (the EML) 24c is formed of droplets delivered by such a technique as ink-jet printing (Step S7). Specifically, at this light-emitting-layer forming step, examples of a solvent contained in the light-emitting-layer forming solution include: toluene; and propylene glycol methyl ether acetate (PGMEA). Moreover, a dissolved substance; that is, a light-emitting material (a functional material) is quantum dots containing, for example, C, Si, Ge, Sn, P, Se, Te, Cd, Zn, Mg, S, In, or O.

Note that, if the light-emitting elements Xr, Xg, and Xb are OLEDs, examples of a light-emitting material (a functional material) for the light-emitting-layer forming solution can include the quantum dots containing, for example, C, Si, Ge, Sn, P, Se, Te, Cd, Zn, Mg, S, In, or O, or the organic compound described above, and additionally include such organic light-emitting materials as, for example: anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, or stilbene; a derivative of these materials; a tris(dibenzoylmethyl) phenanthroline europium complex; and ditolylvinylbiphenyl.

Next, the electron-transport layer (the ETL) 24d is formed of droplets delivered by such a technique as ink-jet printing or spin-coating (Step S8). Specifically, at this electron-transport-layer forming step, examples of a solvent for the electron-transport-layer forming solution include, for example: 2-propanol; ethanol; toluene; chlorobenzene; tetrahydrofuran; and 1,4-dioxane. Moreover, a dissolved substance; that is, an electron-transporting material (a functional material) is nanoparticles of, for example, zinc oxide (ZnO) or magnesium zinc oxide (MgZnO).

Note that, if the light-emitting elements Xr, Xg, and Xb are OLEDs, examples of an electron-transporting material (a functional material) for the electron-transport-layer forming solution can include the nanoparticles of zinc oxide (ZnO) and magnesium zinc oxide (MgZnO) described above, and additionally include, for example: quinolone, perylene, phenanthroline, bisstyryl, pyrazine, triazole, oxazole, oxadiazole, fluorenone; a derivative of these materials; and such metal complexes as, specifically, 3,3'-bis(9H-carbazol-9-yl) biphenyl (mCBP), 1,3,5-tris(N-phenylbenzimidazol-2-yl) benzene (TPBI), 3-phenyl-4(1'-naphthyl)-5-phenyl-1,2,4-triazole (TAZ), 1,10-phenanthroline, and alq(tris(8-hydroxyquinoline)aluminium.

Next, the electron-injection layer (the EIL) 24e is formed of droplets delivered by such a technique as ink-jet printing or spin-coating (Step S9). Specifically, at this electron-injection-layer forming step, examples of a solvent for the electron-injection-layer forming solution include: 2-propanol; ethanol; toluene; chlorobenzene; tetrahydrofuran; and 1,4-dioxane. Moreover, a dissolved substance; that is, an electron-injection material (a functional material) is nanoparticles of, for example, zinc oxide (ZnO) or magnesium zinc oxide (MgZnO). Furthermore, an example of an additive material includes, similar to the hole-injection-layer forming solution, an organic salt selected from a group consisting of: quaternary ammonium salt; lithium tetrafluoroborate salt; and lithium hexafluorophosphate salt.

Note that, if the light-emitting elements Xr, Xg, and Xb are OLEDs, examples of an electron-injecting material (a functional material) for the electron-injection-layer forming solution can include the nanoparticles of zinc oxide (ZnO) and magnesium zinc oxide (MgZnO) described above, and additionally include, for example: quinolone, perylene, phenanthroline, bisstyryl, pyrazine, triazole, oxazole, oxadiazole, fluorenone; a derivative of these materials; and such metal complexes as, specifically, for example, 3,3'-bis(9H-carbazol-9-yl)biphenyl (mCBP), 1,3,5-tris(N-phenylbenzimidazol-2-yl)benzene (TPBI), 3-phenyl-4(1'-naphthyl)-5- phenyl-1,2,4-triazole (TAZ), 1,10-phenanthroline, and alq (tris(8-hydroxyquinoline)aluminium.

Then, on the electron-injection layer 24e, a metal thin film made of such a metal as aluminum or silver is formed as the second electrode (the cathode) 25, using by, for example, vapor deposition or sputtering (Step S10).

After that, the inorganic sealing film 26 is formed to cover the second electrode 25. Then, on the inorganic sealing film 26, a material (a precursor) of the organic film 27 is applied by ink-j et printing. The material cures to form the organic film 27. Moreover, the inorganic sealing film 28 is formed above the organic film 27 (Step S11). As a result, as illustrated in FIG. 2, the display device 2 including the RGB light-emitting elements Xr, Xg, and Xb are produced.

Thus, the display device 2 can be produced as described above.

In the display device 2 of the above embodiment, the nanoparticle layer 24f contains ITO nanoparticles (metal oxide nanoparticles) FP that are electrically conductive. Moreover, the nanoparticle layer 24f is provided on the surface of the first electrode 22 toward the light-emitting layer 24c. Hence, the display device 2 of this embodiment can readily improve efficiency in injecting charges (holes) from the first electrode 22 toward the light-emitting layer 24c. As a result, in this embodiment, the display device 2 can readily improve efficiency in releasing light from the light-emitting layer 24c.

Here, with reference to FIG. 7, advantageous effects of the display device 2 of this embodiment are specifically described. FIG. 7(a) is a graph showing an exemplary test result illustrating variations in light releasing efficiency, the variations being observed when a total thickness of a first electrode and a nanoparticle layer in FIG. 4 is changed. FIG. 7(b) shows a specific exemplary configuration of a nanoparticle layer for each of red, green and blue light-emitting elements. Note that the test result illustrated in FIG. 7(a) is obtained when the hole-injection layer is formed of PEDOT: PSS (40 nm), the hole-transport layer is formed of TFB (35 nm), the light-emitting layer is formed of quantum dots (30 nm), the electron-transport layer is formed of ZnO nanoparticles (50 nm), and the second electrode is formed of a multilayer stack including MgAg (15 nm) and MoO$_3$ (20 nm).

In FIG. 7(a), a curve 80r represents an exemplary simulation result showing a value of efficiency in releasing light (a red light) from the light-emitting layer 24cr of the red light-emitting element Xr when the total thickness of the first electrode 22 and the nanoparticle layer 24fr is changed. Moreover, a curve 80g represents an exemplary simulation result showing a value of efficiency in releasing light (a green light) from the light-emitting layer 24cg of the red light-emitting element Xg when the total thickness of the first electrode 22 and the nanoparticle layer 24fg is changed. Furthermore, a curve 80b represents an exemplary simulation result showing a value of efficiency in releasing light (a blue light) from the light-emitting layer 24cb of the blue light-emitting element Xb when the total thickness of the first electrode 22 and the nanoparticle layer 24fb is changed.

The curves 80r, 80g, and 80b show that, for example, when, in the first electrode 22, ITO on the silver (a reflective layer) contained in the first electrode 22 has a thickness of 10 nm, (that is, when each of the nanoparticle layers 24fr, 24fg, and 24fb has a thickness of 0 nm), the light releasing efficiency is higher in the order of the red light-emitting element Xr, the green light-emitting element Xg, and the blue light-emitting element Xb. Then, when each thickness of the nanoparticle layers 24fr, 24fg, and 24fb is increased, the curves 80r, 80g, and 80b show that the light releasing efficiency for the respective colors varies in the red light-emitting element Xr, the green light-emitting element Xg, and the blue light-emitting element Xb.

Moreover, the light-emitting elements X are configured as illustrated in, for example, FIG. 7(b), when the light releasing efficiency is maximized, for the respective colors of the red light-emitting element Xr, the green light-emitting element Xg, and the blue light-emitting element Xb, in accordance with the results represented by the curves 80r, 80g, and 80b. Specifically, a preferable example is confirmed as follows. In the red light-emitting element Xr, the nanoparticle layer 24fr has a thickness of 0 nm; that is, the nanoparticle layer 24fr is omitted. In the green light-emitting element Xg, the nanoparticle layer 24fg has a thickness of 100 nm. In the blue light-emitting element Xb, the nanoparticle layer 24fg has a thickness of 80 nm.

Next, an exemplary result of anopriorther test conducted by the inventors of the disclosure is described with reference to Table 1. In this test, prepared samples include first electrodes having the same thickness and nanoparticle layers having different thickness. The study was conducted of the resistance value and the productivity of the samples. Table 1 shows an example of the test result.

TABLE 1

|  | First Comparative Example | First Embodiment | Second Embodiment | Third Embodiment | Second Comparative Example |
|---|---|---|---|---|---|
| Thickness of First Electrode (nm) | 10 | 10 | 10 | 10 | 10 |
| Thickness of Nanoparticle Layer (nm) | 650 | 600 | 300 | 15 | 10 |
| Resistance Value | Good | Good | Good | Good | High |
| Productivity | Low | Good | Good | Good | Good |

In Table 1, a first comparative example confirms that, if the nanoparticle layer 24f has a thickness of more than 600 nm, the productivity of the light-emitting element X (the display device 2) is low. Moreover, in Table 1, a second comparative example proves that, if the nanoparticle layer 24f has a thickness of less than 15 nm, the resistance of the nanoparticle layer 24f is high and the emission efficiency of the display device 2 is low.

Meanwhile, in Table 1, first to third examples prove that if the nanoparticle layer 24f has a thickness of 15 nm or more and 600 nm or less, the decrease in productivity of the light-emitting element X (the display device 2) can be prevented. In addition, the increase in the resistance of the nanoparticle layer 24f can be reduced, and the decrease in the emission efficiency of the display device 2 can be prevented.

First Modification

FIG. 8 is a cross-sectional view of a first modification of the display device.

In the drawing, a main difference between this first modification and the first embodiment is that, in the first modification, the hole-injection layer 24a and the hole-transport layer 24b are provided as common layers in common among all the sub-pixels. Note that like reference signs denote common constituent features between this first modification and the first embodiment. Such constituent features will not be elaborated upon here.

In the display device 2 of this first modification, as illustrated in FIG. 8, the hole-injection layer 24a and the hole-transport layer 24b are formed monolithically in common among the light-emitting elements Xr, Xg, and Xb. That is, each of the hole-injection layer 24a and the hole-transport layer 14b can be formed not only by the ink-jet printing described in the first embodiment, but also by another technique; that is, delivering droplets such as spin-coating.

As can be seen, this first modification can achieve similar advantageous effects as those of the first embodiment. Moreover, the hole-injection layer 24a and the hole-transport layer 24b are formed as common layers, such that the production step of the display device 2 can be simplified.

Second Modification

FIG. 9 illustrates an essential configuration of a second modification of the display device. FIG. 9(a) is a perspective view of a specific configuration of a second electrode in the second modification. FIG. 9(b) is a drawing illustrating a specific configuration of a light-emitting-element layer in the second modification. FIG. 9(c) is a graph showing an advantageous effect of the second modification.

In the drawings, a main difference between this second modification and the first embodiment is that, in the second modification, the second electrode 25 includes an electron-injection layer and an electron-transport layer. Note that like reference signs denote common constituent features between this second modification and the first embodiment. Such constituent features will not be elaborated upon here.

In the display device 2 of this second modification, as illustrated in FIG. 9(a), the second electrode 25 contains: metal nanowires, for example, silver nanowires NW; and zinc oxide (ZnO) nanoparticles NP that are an electron-injection-layer material and an electron-transport material. That is, a silver-nanowire solution and a zinc-oxide-nanoparticle solution are mixed at a predetermined ratio and stirred. The mixture is applied and dried to form the second electrode 25 in which the silver nanowires NW and the zinc oxide nanoparticles NP are mixed together. Specifically, the silver nanowires NW are three-dimensionally arranged at random in interstitial spaces between the zinc oxide nanoparticles NP (having an average particle size of 1 to 30 nm).

Moreover, as illustrated in FIG. 9(b), the display device 2 of this second modification includes: the first electrode 22 (the anode); the nanoparticle layer 24f; a hole-transport layer (not shown); the light-emitting layer 24c (e.g. the quantum-dot light-emitting layer); and the second electrode (the common cathode) 25 including the not-shown electron-injection layer and electron-transport layer, all of which are provided in the stated order.

Furthermore, the configuration in FIG. 9(a) shows that, in the second electrode 25, an area of contact increases between the silver nanowires NW and the zinc oxide nanoparticles NP serving as an electron-transport material. Hence, as FIG. 9 (c) shows, within a current density range of 0 to 50 (mA/cm$^2$), an external quantum effect UB (a standard value with respect to a reference value) of a light-emitting element X in this second modification 2 exhibits a significant increase compared with the configuration in FIG. 3; that is, an external quantum effect UA (a reference value of each of the current densities=1) of a light-emitting element X in which the second electrode 25 is formed on the electron-injection layer (the zinc oxide nanoparticle layer) 24e, and with a standard external quantum efficiency Ua (a standard value with respect to a reference value) of a light-emitting element having a cathode made of a typical silver thin film.

Furthermore, compared with a case where the electron-transport layer 24d, the electron-injection layer 24e, and the second electrode (the common cathode) 25 are formed at separate steps, the configuration in FIG. 9(a) can reduce the number of steps.

In addition, excessive metal nanowires NW deteriorate capability to transport electrons to the light-emitting layer 24c, and insufficient metal nanowires NW increase the resistance value. Hence, a volume ratio of the metal nanowires NW to the ZnO nanoparticles NP ranges 1/49 to 1/9.

As can be seen, this second modification can achieve similar advantageous effects as those of the first embodiment.

Third Modification

FIG. 10 is a cross-sectional view of a third modification of the display device.

In the drawing, a main difference between this third modification and the first embodiment is that, in the third modification, the nanoparticle layer 24f is formed by a lift-off process. Note that like reference signs denote common constituent features between this third modification and the first embodiment. Such constituent features will not be elaborated upon here.

As illustrated in FIG. 10, the display device 2 of this third modification includes the edge cover film 23 provided to cover each edge of the nanoparticle layers 24fr, 24fg, and 24fb. That is, as to the display device 2 of this third embodiment, the edge cover film 23 is deposited after the nanoparticle layers 24fr, 24fg, and 24fb have been formed.

Here, also with reference to FIGS. 11 and 12, a method for producing the display device 2 of this third modification is specifically described. FIG. 11 is a flowchart showing a method for producing the display device illustrated in FIG. 10. FIG. 12 is a flowchart specifically showing a method for producing essential features of the display device illustrated in FIG. 10.

As illustrated in FIG. 11, in this third modification, the first electrodes 22 are formed (Step S2). After that, the lift-off process is utilized to form the nanoparticle layers 24fr, 24fg, and 24fb on the respective first electrodes 22 of the light-emitting elements Xr, Xg, and Xb (Step S4). After that, the edge cover film 23 is formed to cover each edge of the nanoparticle layers 24fr, 24fg, and 24fb (Step S3).

Moreover, at the nanoparticle-layer forming step of Step S4, as illustrated at Step S43 in FIG. 12, a resist material applying step is carried out to apply a resist material (not-shown) on the surface of the first electrodes 22. The resist material is photosensitive. At this resist material applying step, example of the resist material to be used include AZ521 (Merck), the TLO series (Tokyo Ohka Kogyo Co., Ltd.), ZPN 1150 (Zeon Corporation), and the LUMILON series (JSR Corporation).

Next, as shown at Step S44 in FIG. 12, an exposing step is carried out to expose the resist material with predetermined light. At this exposing step, the predetermined light is, for example, such an ultraviolet ray (a UV ray) as an i-ray, a g-ray, or an h-ray.

After that, as illustrated at Step S45 in FIG. 12, a patterning step is carried out to pattern the resist material into a predetermined shape, by carrying out a developing step to the resist material using a predetermined developing solution. At this patterning step, the predetermined developing solution is, for example, a 2.38% TMAH solution.

Next, as shown at Step S41 in FIG. 12, a solution droplet delivering step is carried out as seen in the first embodiment to deliver the solution in the form of droplets onto the patterned resist material. After that, a resist material removing step is carried out to remove the resist material. Moreover, a predetermined remover to be used is, for example, the AZ100 Remover. Finally, as shown at Step S42 in FIG. 12, a forming step of the nanoparticle layer 24f is carried out as seen in the first embodiment.

After that, for each of the different colors of the light to be emitted, the resist material applying step, the exposing step, the patterning step, and the resist material removing step shown at Steps S43 to S46 are sequentially and repeatedly carried out. Hence, as illustrated in FIG. 4, the nanoparticle layer 24fr of the red light-emitting element Xr, the nanoparticle layer 24fg of the green light-emitting element Xg, and, furthermore, the nanoparticle layer 24fb of the blue light-emitting element Xb are formed. As a result, in this embodiment, the delivery of droplets and the lift-off process are combined to form a pixel pattern corresponding to three colors of R, G, and B.

As can be seen, this third modification can achieve similar advantageous effects as those of the first embodiment.

Second Embodiment

FIG. 13 is a cross-sectional view of an essential configuration of a display device according to a second embodiment of the disclosure. FIG. 14 is a cross-sectional view of a specific configuration of a functional layer illustrated in FIG. 13. FIG. 15 is a cross-sectional view of a specific exemplary configuration of light-emitting elements illustrated in FIG. 13.

In the drawings, a main difference between this embodiment and the first embodiment is that this embodiment presents an inverted structure including: a first electrode 35 serving as a cathode; a functional layer 34; and a second electrode 32 serving as an anode, all of which are provided in the stated order from toward the thin-film transistor layer 4. Note that like reference signs denote common constituent features between this second embodiment and the first embodiment. Such constituent features will not be elaborated upon here.

In the display device 2 of this embodiment, as illustrated in FIG. 13, each of the light-emitting elements Xr, Xg, and Xb includes: the first electrode (the cathode) 35; the functional layer 34; and the second electrode (the anode) 32 sequentially provided on the thin-film transistor layer 4. Moreover, as illustrated in FIG. 14, the functional layer 34 includes: a nanoparticle layer 34f; an electron-injection layer 34a; an electron-transport layer 34b; a light-emitting layer 34c; a hole-transport layer 34d; and a hole-injection layer 34e, all of which are stacked on top of another in the stated order from below. Similar to the nanoparticle layer 24f of the first embodiment, the nanoparticle layer 34f contains for example, ITO nanoparticles FP as metal oxide nanoparticles. Furthermore, in this embodiment, the electron-injection layer 34a and the electron-transport layer 34b are respectively a charge-injection layer and a charge-transport layer provided between the nanoparticle layer 34f and the light-emitting layer 34c.

In addition, as illustrated in FIG. 15, the display device 2 of this embodiment has the light-emitting elements Xr, Xg, and Xb separated from one another by the edge cover film 23 serving as a bank. For each of the light-emitting elements X, the first electrode 35, nanoparticle layers 34fr, 34fg, and 34fb (collectively referred to as the nanoparticle layer 34f), the electron-injection layer 34a, the electron-transport layer 34b, and light-emitting layers 34cr, 34cg, and 34cb (collectively referred to as the light-emitting layer 34c) are provided in shapes of islands. Furthermore, the light-emitting elements X are provided with the hole-transport layer 34d, the hole-injection layer 34e, and the second electrode 32, each of which is shaped monolithically in common among all the sub-pixels SP.

As can be seen, this embodiment can achieve similar advantageous effects as those of the first embodiment.

First Modification

FIG. 16 is a cross-sectional view of a first modification of the display device illustrated in FIG. 13.

In the drawing, a main difference between this first modification and the second embodiment is that, in the modification, the electron-injection layer 34a and the electron-transport layer 34b are provided as common layers in common among all the sub-pixels. Note that like reference signs denote common constituent features between this first modification and the second embodiment. Such constituent features will not be elaborated upon here.

In the display device 2 of this first modification, as illustrated in FIG. 16, the electron-injection layer 34a and the electron-transport layer 34b are formed monolithically in common among the light-emitting elements Xr, Xg, and Xb. That is, each of the electron-injection layer 34a and the electron-transport layer 34b can be formed not only by the ink-jet printing described in the second embodiment, but also by delivering droplets such as spin-coating.

As can be seen, this first modification can achieve similar advantageous effects as those of the second embodiment. Moreover, the electron-injection layer 34a and the electron-transport layer 34b are formed as common layers, such that the production step of the display device 2 can be simplified.

Second Modification

FIG. 17 is a cross-sectional view of a second modification of the display device illustrated in FIG. 13.

In the drawing, a main difference between this second modification and the second embodiment is that, in the modification, the nanoparticle layer 34f is formed by a lift-off process. Note that like reference signs denote common constituent features between this second modification and the second embodiment. Such constituent features will not be elaborated upon here.

As illustrated in FIG. 17, the display device 2 of this second modification includes the edge cover film 23 provided to cover each edge of the nanoparticle layers 34fr, 34fg, and 34fb. That is, as to the display device 2 of this second modification, the edge cover film 23 is deposited after the nanoparticle layers 34fr, 34fg, and 34fb have been formed by a lift-off process as seen in the third modification of the first embodiment.

As can be seen, this second modification can achieve similar advantageous effects as those of the second embodiment.

INDUSTRIAL APPLICABILITY

The disclosure is useful for a display device that can improve efficiency in releasing light from a light-emitting layer, and a method for producing the display device.

The invention claimed is:

1. A display device including a display region having a plurality of pixels, and a frame region surrounding the display region, the display device comprising:
   a thin-film-transistor layer;
   a light-emitting-element layer including a plurality of light-emitting elements, each including a first electrode, a light-emitting layer, and a second electrode, the plurality of light-emitting elements being formed to emit light in different colors; and
   a nanoparticle layer provided on a surface of the first electrode toward the light-emitting layer, and containing metal oxide nanoparticles that are electrically conductive,
   wherein, between the light-emitting layer and the nanoparticle layer, a charge-injection layer and a charge-transport layer are sequentially provided from the nanoparticle layer, and
   the charge-injection layer and the charge-transport layer are, respectively, a hole-injection layer and a hole-transport layer.

2. The display device according to claim 1,
   wherein the nanoparticle layer has a thickness of 15 nm or more and 600 nm or less.

3. The display device according to claim 1,
   wherein the first electrode and the nanoparticle layer are formed of a same metal oxide.

4. The display device according to claim 3,
   wherein the first electrode and the nanoparticle layer are formed of an indium tin oxide (ITO).

5. The display device according to claim 1,
   wherein the plurality of light-emitting elements includes:
      a red light-emitting element including a red light-emitting layer that emits a red light,
      a green light-emitting element including a green light-emitting layer that emits a green light, and
      a blue light-emitting element including a blue light-emitting layer that emits a blue light.

6. The display device according to claim 5,
   wherein, for each of the red light-emitting element, the green light-emitting element, and the blue light-emitting element, a total thickness of the first electrode and the nanoparticle layer is different.

7. The display device according to claim 1,
   wherein the light-emitting layer is a quantum-dot light-emitting layer containing quantum dots.

8. The display device according to claim 7,
   wherein the quantum-dot light-emitting layer includes:
      a red quantum-dot light-emitting layer configured to emit a red light,
      a green quantum-dot light-emitting layer configured to emit a green light, and
      a blue quantum-dot light-emitting layer configured to emit a blue light.

* * * * *